United States Patent
Lee et al.

[11] Patent Number: 6,166,961
[45] Date of Patent: Dec. 26, 2000

[54] APPROACH TO PROVIDE HIGH EXTERNAL VOLTAGE FOR FLASH MEMORY ERASE

[75] Inventors: Peter Wung Lee; Fu-Chang Hsu, both of Saratoga; Mike Hsinyih Chen, San Jose, all of Calif.

[73] Assignee: Aplus Flash Technology, Inc., Santa Clara, Calif.

[21] Appl. No.: 09/377,545

[22] Filed: Aug. 19, 1999

[51] Int. Cl.[7] .................................................. G11C 16/04
[52] U.S. Cl. .............................. 365/185.29; 365/185.18; 365/185.31
[58] Field of Search ................... 365/189.09, 185.18, 365/185.29, 185.31, 185.33

[56] References Cited

U.S. PATENT DOCUMENTS

| | | | |
|---|---|---|---|
| 5,491,656 | 2/1996 | Sawada | 365/185.29 |
| 5,668,758 | 9/1997 | Yiu et al. | 365/185.23 |
| 5,781,477 | 7/1998 | Rinerson et al. | 365/185.29 |
| 5,818,758 | 10/1998 | Wojciechowski | 365/185.18 |
| 5,942,808 | 8/1999 | Kaneko et al. | 307/18 |
| 5,991,221 | 11/1999 | Ishikawa et al. | 365/226 |

*Primary Examiner*—Son Mai
*Attorney, Agent, or Firm*—George O. Saile; Stephen B. Ackerman

[57] ABSTRACT

In this invention external high voltages are connected to a chip containing a flash memory that are connected to selected cells to be erased. Internal pump circuits contained on the chip are turned off while the external voltages are used. The external voltages, a high negative voltage and a high positive voltage, are connected to gates and sources respectively of selected cells to be erased by a voltage control module. The external voltages are used during manufacture during program/erase operations to perform the erase function efficiently. The internal high voltage pump circuits are used to erase flash memory cells after being assembled on a circuit board by a user. Two level shifter circuits are disclosed that form a part of the voltage control module. The level shifter circuits apply voltages to the flash memory cells and provide voltages that select and deselect the cells for erasure.

9 Claims, 4 Drawing Sheets

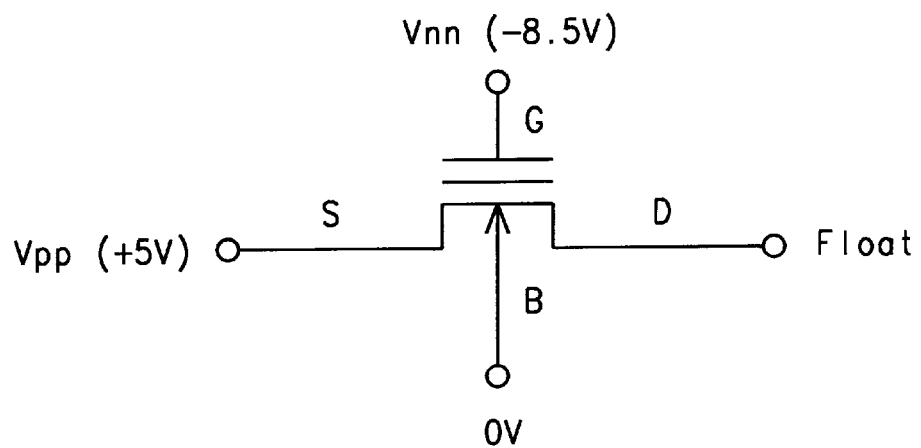
FIG. 1a – Prior Art
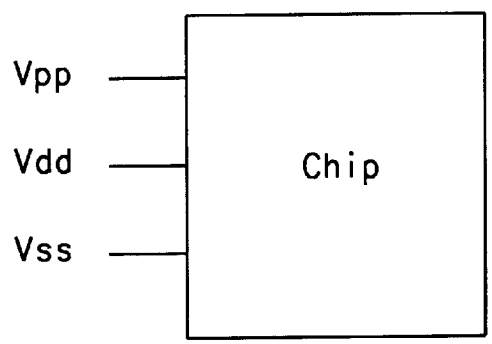
FIG. 1b – Prior Art

APPROACH TO PROVIDE HIGH EXTERNAL VOLTAGE FOR FLASH MEMORY ERASE

BACKGROUND OF THE INVENTION

1. Field of Invention

This invention relates to semiconductor memories, in particular flash memories and providing voltages for erase operations.

2. Description of Related Art

In conventional flash memories both a high negative and a high positive voltage are required to erase data in flash memory cells. The high negative voltage is applied to the gate of the flash cell being erased and the high positive voltage is applied to the source. The drain is usually left floating. This requires that both a positive pump circuit and a negative pump circuit exist on the flash memory chip if the flash memory cells are to be erased after assembly. There are several problems that must be handled when two pump circuits of opposite polarity are on the same chip. Besides increase in chip power, considerable protection circuitry and guarding methodology are required to isolate the pump circuitry and avoid device breakdown.

Using internal pump circuits to perform erasure of flash memory cells is a somewhat slow process since it takes time for the pump circuits to get to the required voltage after being activated. For this reason it is advantageous to programming and erasure during manufacture to provide high negative and high positive voltages to chip pads from external to the chip, thus speeding up the programming process. In the manufacture of flash memory cells providing an external high positive voltage has been known for some time; however, because of the difficulties of handling a high negative voltage, external supplied high negative voltages have not been previously used. By providing an externally applied high negative voltage along with an externally applied high positive voltage to a chip containing a flash memory shorter erase/program, lower power consumption and faster throughput can be realized.

SUMMARY OF THE INVENTION

In the present invention a method and circuitry are disclosed that allow a high negative voltage and a high positive voltage to be applied to flash memory cells being erased from external to the chip containing the flash memory cells with or without high negative voltage and high positive voltage pump circuits. The high negative voltage and the high positive voltage are connected to the chip through chip pads and are used during manufacture to erase and program the chip. If erasure and programming of flash memory cells is not required after assembly the high positive and high negative voltage pump circuits are not implemented on the chip, and the high voltage and high positive voltage chip pads are the only source of voltages for flash memory cell erasure.

If the chip containing flash memory cells has high negative and high positive voltage pump circuits, the chips can be erased/programmed by a user after assembly. In this case the external high negative and high positive voltages are connected in parallel to the output of the corresponding pump circuits, and the pump circuits are controlled off when the external high voltages are to be used. The external high voltages are used before assembly during manufacture to shorten erase/program time, lower power consumption and increase manufacturing throughput. After assembly no external voltages are connected to the high negative and high positive voltage pads, and the internal pump circuits must be used if the flash memory cells are to be erased/programmed by a user.

A high negative voltage level shifter circuit using NMOS transistors in a P-well inside a deep N-well on a P-substrate provides select and deselect bias for gates of flash memory cells. To avoid forward biasing P-N junctions when a high negative voltage is applied to a gate of a cell being erased, a triple well comprising a P-well inside a deep N-well on a P-substrate is used for the NMOS transistors. The negative voltage level shifter circuit provides a high negative voltage to the gate of a flash memory cell being erased and a moderate positive voltage to the gate of a cell not being erased.

The high negative voltage level shifter forms a part of a voltage control module located on the chip containing a flash memory. Control signals connected to the control module provide commands that direct the output state of the high negative voltage level shifter between a high negative voltage to select flash memory cells for erasure and a moderate positive voltage to deselect the flash memory cells from erasure. The level shifter comprises a cross coupled pair of N-channel transistors that provide two operating states. A voltage selector circuit comprising two P-channel transistors is connected to the cross coupled pair of N-channel transistors through a bias buffer circuit to select one of the two operating states. The voltage selector circuit is switched between two input voltages which switches the cross coupled pair of N-channel transistors between two states and drives the differential circuit to switch between a high negative voltage to select the gate of a flash memory cell for erasure and a moderate positive voltage that deselects the gate of a flash memory cell from the erase operation.

Similar to the high negative voltage level shifter, a high positive voltage level shifter provides a high positive voltage to the source of a flash memory cell being erased and a moderate positive voltage to the source of a flash memory cell being deselected from the erase operation. The high positive voltage level shifter circuit uses PMOS transistors in an N-well on a P-substrate and provides select and deselect bias for sources of flash memory cells. To avoid forward biasing P/N junctions when a high positive voltage is applied to a gate of a cell being erased the P-channel transistors are contained in an N-well. The positive voltage level shifter circuit provides a high positive voltage to the source of a flash memory cell being erased and a moderate positive voltage to the source of a cell not being erased.

The high positive voltage level shifter forms a part of a voltage control module located on the chip containing a flash memory. Control signals connected to the control module provide commands that direct the output state of the high positive voltage level shifter between a high positive voltage to select flash memory cells for erasure and a moderate positive voltage to deselect the flash memory cells from erasure. The level shifter comprises a cross coupled pair of P-channel transistors that provide two operating states. A voltage selector circuit comprising two N-channel transistors is connected to the cross coupled pair of P-channel transistors through a bias buffer circuit to select one of the two operating states. The voltage selector circuit is switched between two input voltages which switches the cross coupled pair of P-channel transistors between two states and drives the differential circuit to switch between a high positive voltage to select the source of a flash memory cell for erasure and a moderate positive voltage that deselects the source of a flash memory cell from the erase operation.

It is possible to provide the erase function for flash memory cells with only one voltage requiring a pump circuit or an external chip pad. This can be done through voltage rotation by adding a negative voltage to the high positive gate erase voltage so that the source erase voltage becomes the chip positive bias voltage. Then adding this same negative voltage to the high negative gate voltage and to the semiconductor bulk with the drain remaining floating. This voltage rotation eliminates the need for the high positive source voltage and in turn eliminates the need for the high positive voltage pump circuit.

BRIEF DESCRIPTION OF THE DRAWINGS

This invention will be described with reference to the accompanying drawings, wherein:

FIG. 1a is a diagram of a flash memory cell of prior art with bias for an erase operation, FIG. 1b is a basic diagram showing chip voltages of prior art.

DETAILED DESCRIPTION OF THE PREFERRED EMBODIMENT

In FIG. 1a is shown an example of a flash memory cell of prior art biased to be erased using a high negative voltage. The control gate, G, is biased to a high negative voltage Vnn. An example of the high negative voltages is shown at approximately −8.5V. The source, S, is biased to a high positive voltage Vpp that is higher than the chip bias Vdd. An example of Vpp is shown at approximately +5V. The drain, D, is floating and the semiconductor bulk, B, is at 0V. To satisfy the voltage conditions shown in FIG. 1a, two high voltages are required to be provided by either or both external chip pads and internal voltage pump circuits on the flash memory chip. In FIG. 1b is shown a basic diagram of prior art of a chip and connected external voltages to power a flash memory chip. Vdd and Vss are chip bias voltages with Vpp being a high positive voltage necessary to provide bias to a source of a flash memory cell being erased. The Vnn voltage shown in FIG. 1a is created by using an internal pump circuit on the flash memory chip.

Figure 2:
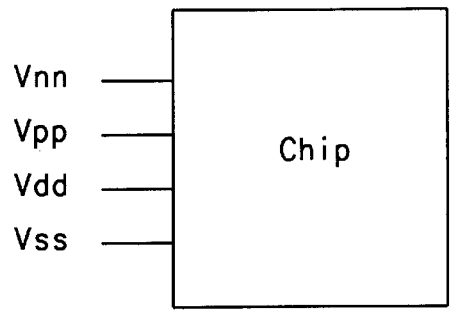
FIG. 2 is a diagram showing a flash memory chip voltages.
Figure 3:
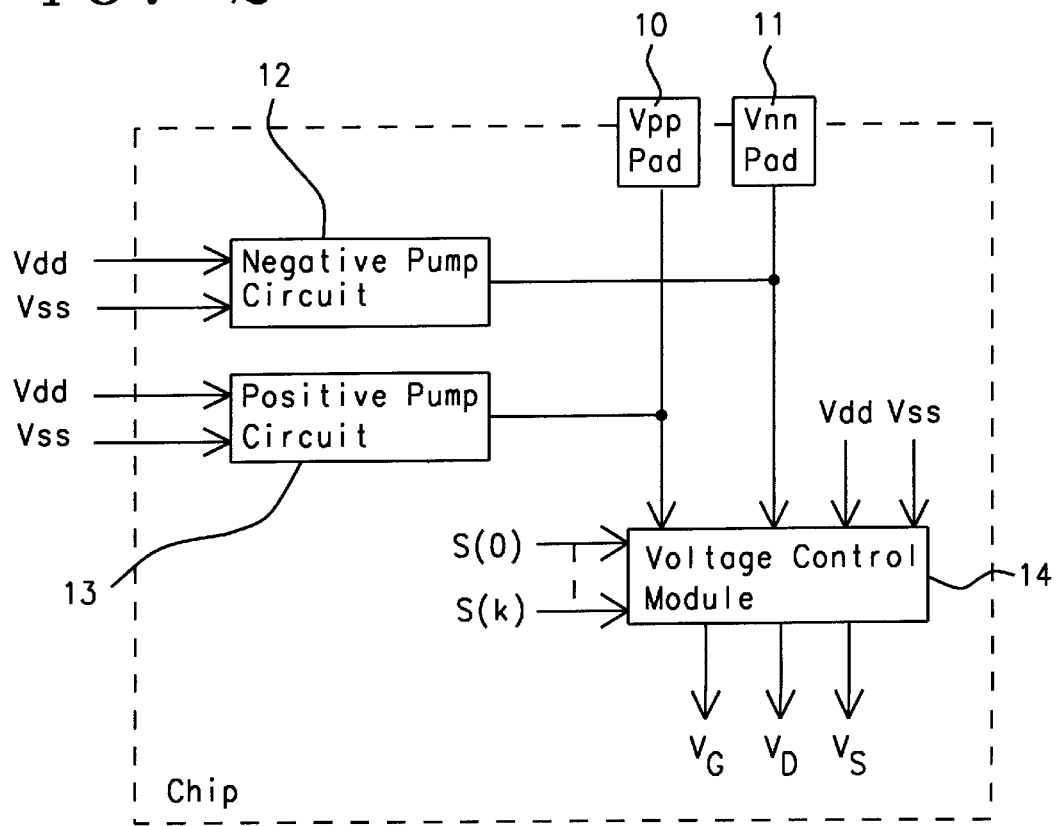
FIG. 3 is a block diagram showing interconnection of pump circuits and external voltages to a voltage control module on a flash memory chip.

In FIG. 2 is shown a basic diagram of external chip voltages connected to a flash memory chip of this invention. Besides the normal flash memory chip voltages Vdd and Vss, a high positive voltage Vpp and a high negative voltage Vnn are connected to the chip. Vnn and Vpp provide external voltages to efficiently erase flash memory cells during programming and erase operations during manufacturing operations. In FIG. 3 is shown a block diagram of connections of the external Vpp 10 and Vnn 11 chip pad connections along with internal pump circuits 12 and 13. The positive external voltage Vpp is connected to the chip pad 10 and further connected in parallel with the output of the positive pump circuit 13 to the voltage control module 14. The negative external voltage Vnn is connected to the chip pad 11 and further connected in parallel with the output of the negative pump circuit 12 to the voltage control module 14. Chip bias voltages Vdd and Vss are connected to power the negative pump circuit 12 and the positive pump circuit 13. Chip bias voltages Vdd and Vss are also supplied to the voltage module 14. A set of selector signals, S(0) to S(k), are supplied to the voltage control module 14 to select the voltages to be connected to the gate, G, the source, S, and the drain, D, of the flash memory cells.

Continuing to refer to FIG. 3, when the flash memory is being programmed or erased during manufacture, the external Vpp and Vnn voltages are connected to the Vpp pad 10 and the Vnn pad 11 respectively. When Vpp and Vnn are applied externally the internal positive voltage pump 13 and internal negative voltage pump 12 are turned off, and the voltage control module gets the high positive voltage from the Vpp pad 10 and the high negative voltage from the Vnn pad 11. During erase operations when no external Vpp and Vnn voltages are available, the internal negative pump circuit 12 is used to provide Vnn to the voltage control module 14, and the internal positive pump circuit 13 is used to provide Vpp to the voltage control module 14. The selector signals S(0) to S(k) control the voltage control module to connect voltages to the gate, source and drain of each flash memory cell to select or deselect the cells for erase, programming and reading.

Figure 4A:
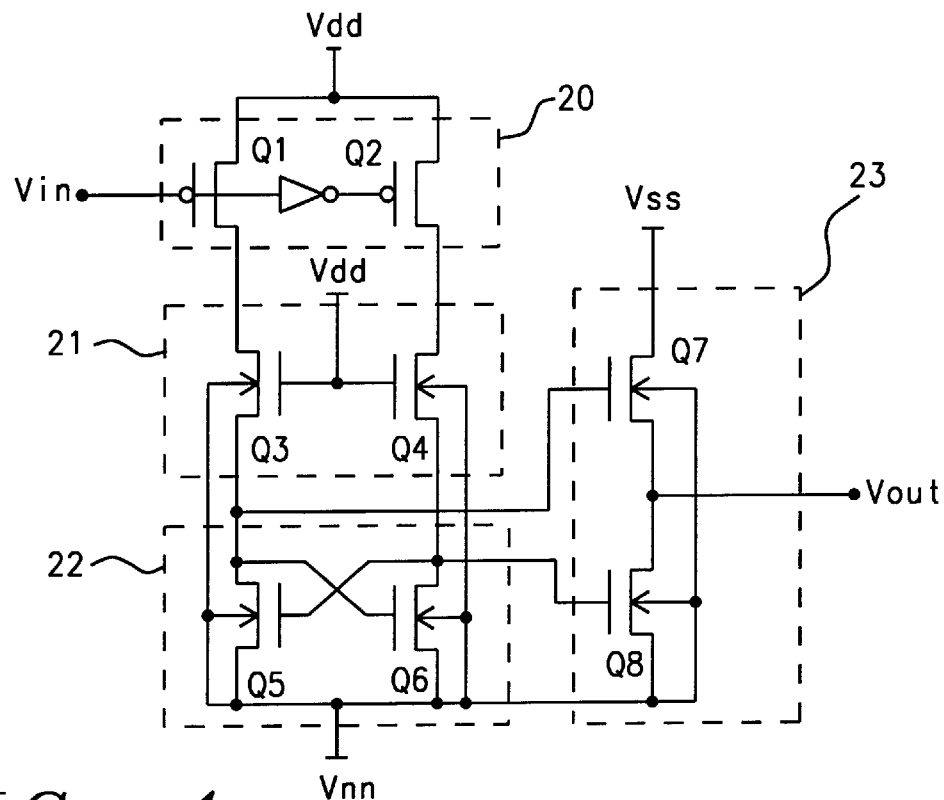
FIG. 4a is a circuit diagram of a level shifter that provides a high negative voltage to a gate of a flash memory cell to be erased.

In FIG. 4a is shown a level shifting circuit which is a part of the voltage control module 14 that produces an output Vout to be connected to the gate of a flash memory cell for erase operations. Vout is either Vnn or Vss depending on the switch state of the circuit. Vnn is a high negative voltage used erase the flash memory cell and Vss is a chip bias voltage used to deselect the flash memory cell from erasure. Switching the input voltage, Vin, between Vdd and Vss switches the output voltage, Vout, between Vss and Vnn. The input voltage, Vin, is connected to a selector circuit 20. The selector circuit 20 comprises two P-channel transistors Q1 and Q2 with their gates connected together by an inverter circuit Inv1 and Vin connected to the gate of Q1. The selector circuit 20 drives a cross coupled pair of N-channel transistor 22 through a bias buffer circuit 21. The bias buffer circuit 21 is used to provide a means to drop some of the voltage between Vdd and Vnn and reduce potential breakdown problems. A differential circuit 23 is driven by the cross coupled circuit 22 to produce a level shifted output Vout dependent on the input voltage Vin. The N-channel transistors Q3, Q4, Q5, Q6, Q7, and Q8 are formed in a P-well biased to Vnn. The P-well is in a deep N-well biased at Vdd and residing on a P-substrate biased at Vss.

Continuing to refer to FIG. 4a, when Vin=Vss, Vdd is applied to the drain of Q5 and the gate of Q6 of a cross coupled bi-state circuit 22 through Q1 of the selector circuit 20 and Q3 of a voltage buffer circuit 21. Q6 is switched on putting Vnn on the drain of Q6 and the gates of Q5 and Q8. Transistor Q5 is switched off and Vdd is connected to the gate of Q7 which produces Vout=Vss. Transistors Q7 and Q8 form a differential circuit 23 which produces the output of the level shifter. When Vin=Vdd, Vdd is applied to the drain of Q6 and the gate of Q5 of a cross coupled bi-state circuit 22 through Q2 of the selector circuit 20 and Q3 of a voltage buffer circuit 21. Q5 is switched on putting Vnn on the drain of Q5 and the gates of Q6 and Q7. Transistor Q6 is switched off and Vdd is connected to the gate of Q8 which produces Vout=Vnn.

Figure 4B:
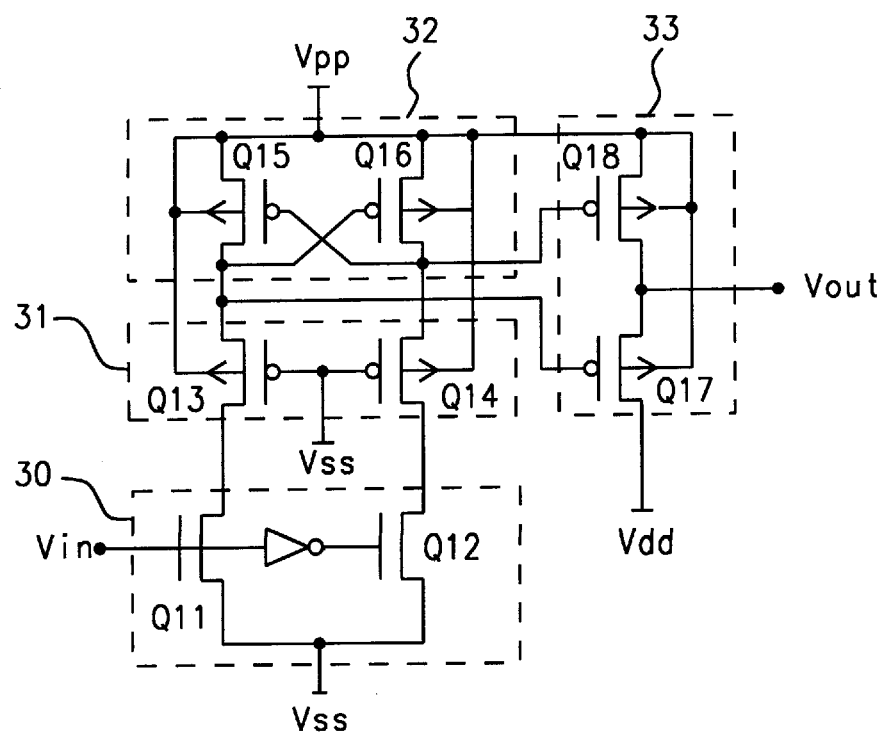
FIG. 4b is a circuit diagram of a level shifter that provides a high positive voltage to a source of a flash memory cell to be erased.

In FIG. 4b is shown a level shifter circuit which is a part of the voltage control module 14 that produces an output voltage Vout which is connected to the source of a flash memory cell that switches between a high positive voltage Vpp and Vdd as the input voltage Vin switches between Vdd and Vss. The circuit of FIG. 4b is similar to the circuit of FIG. 4a, except for differences in voltages and transistor types. The input voltage, Vin, is connected to a selector circuit 30. The selector circuit 30 comprises two N-channel transistors Q11 and Q12 with their gates connected together by an inverter circuit Inv2 and Vin connected to the gate of Q11. The selector circuit 30 drives a cross coupled pair of P-channel transistors 32 through a bias buffer circuit 31. The bias buffer circuit 31 is used to provide a means to drop some of the voltage between Vss and Vpp and reduce potential breakdown problems. A differential circuit 33 is driven by the cross coupled circuit 32 to produce a level shifted output Vout dependent on the input voltage Vin. The P-channel transistors Q13, Q14, Q15, Q16, Q17, and Q18 are formed in an N-well biased to Vpp. The N-well resides on a P-substrate biased at Vss.

Continuing to refer to FIG. 4b, when Vin=Vss, Vss is applied to the drain of Q16 and the gate of Q15 of a cross coupled bi-state circuit 32 through Q12 of the selector circuit 20 and Q14 of a voltage buffer circuit 31. Q15 is switched on putting Vpp on the drain of Q15 and the gates of Q16 and Q17. Transistor Q16 is switched off and Vss is connected to the gate of Q18 which produces Vout=Vpp. Transistors Q17 and Q18 form a differential circuit 33 which produces the output of the level shifter. When Vin=Vdd, Vss is applied to the drain of Q15 and the gate of Q16 of a cross coupled bi-state circuit 32 through Q11 of the selector circuit 30 and Q13 of a voltage buffer circuit 31. Q16 is switched on putting Vpp on the drain of Q16 and the gates of Q15 and Q18. Transistor Q15 is switched off and Vss is connected to the gate of Q17 which produces Vout=Vdd.

Figure 5:
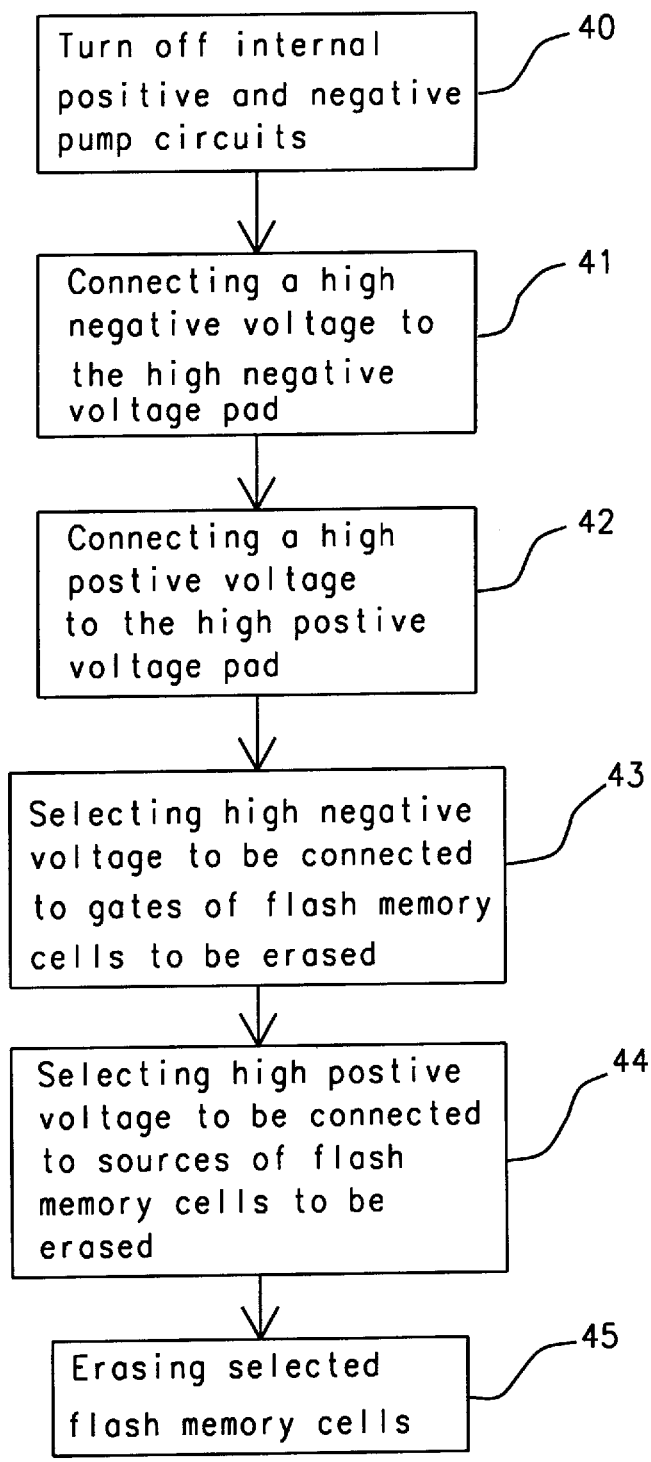
FIG. 5 is a flow diagram for the method of using external voltages to erase a flash memory cell during manufacture.

In FIG. 5 is shown a method used to apply external high negative and high positive voltages to chip pads during manufacture to erase flash memory cells. The internal high negative voltage and the internal high positive pump circuits are turned off 40. Then a high negative voltage is connected to the high negative voltage chip pad, Vnn Pad 41. A high positive voltage is connected to the high positive voltage chip pad, Vpp Pad 42. The high negative voltage is selected by the voltage control module 14 and connected to the gate of flash memory cells selected to be erased 43. The high positive voltage is selected by the voltage control module 14 and connected to the source of flash memory cells selected to be erased 44. The drain of selected flash memory cells is left floating during erase operations. The selected flash memory cell are erased by means of Fowler-Nordheim Tunneling 45.

While the invention has been particularly shown and described with reference to preferred embodiments thereof, it will be understood by those skilled in the art that various changes in form and details may be made without departing from the spirit and scope of the invention.

What is claimed is:

1. A circuit to provide flash memory cell bias for erase operation, comprising:
   a) a negative pump circuit producing a high negative voltage connected to a voltage control module,
   b) a positive pump circuit producing a high positive voltage connected to said voltage control module,
   c) a first external source of high negative voltage connected to output of said negative pump circuit and to said voltage control module through a first chip pad,
   d) a second external source of high positive voltage connected to output of said positive pump circuit and to said voltage control module through a second chip pad,
   e) said negative pump circuit and said positive pump circuit controlled off when said first external source and said second external source are used to program and erase a flash memory cell,
   f) said voltage control module connecting said first and second external source to said flash memory cell for erase and program operation during manufacture.

2. The circuit of claim 1, wherein said voltage control module provides bias to flash memory cells to select cells and deselect cells for program, erase and read operations.

3. A circuit to provide flash memory cell bias for erase operation, comprising:
   a) a negative pump circuit producing a high negative voltage connected to a voltage control module,
   b) a positive pump circuit producing a high positive voltage connected to said voltage control module,
   c) a second source of said high negative voltage externally connected to said voltage control module through a first chip pad,
   d) a second source of said high positive voltage externally connected to said voltage control module through a second chip pad,
   e) said voltage control module providing gate, drain and source bias for flash memory cell during erase operation,
   f) said positive and said negative pump circuits are controlled off when said high negative voltage and said high positive voltage are connected to said voltage control module from external to a flash memory chip.

4. The circuit of claim 3, wherein said positive and said negative pump circuits are not needed if programming of a flash memory chip is only done at a factory.

5. The circuit of claim 3, wherein externally connected high positive and high negative voltages provide speed in programming a flash memory chip.

6. The circuit of claim 3, wherein said positive voltage pump circuit and said externally connected high positive voltage are not needed if flash memory cell voltages during erase are established to have no positive voltage higher than positive chip bias.

7. A method to provide external applied voltages during erase of flash memory cells, comprising:
   a) deactivating internal high negative voltage pump circuit,
   b) deactivating internal high positive voltage pump circuit,
   c) connecting a high negative voltage to an external high negative voltage chip pad,
   d) connecting a high positive voltage to an external high voltage chip pad,
   e) selecting said external high negative voltage to be connected to gates of flash memory cells to be erased,
   f) selecting said external high positive voltage to be connected to sources of said flash memory cells to be erased,
   g) erasing selected flash memory cells using Fowler-Nordheim tunneling.

8. The method of claim 7, wherein connecting said high negative voltage and high positive voltage to said chip pads is done in manufacturing to erase said flash memory cells.

9. The method of claim 7, wherein erasing of flash memory cells is only done in manufacture eliminating the need for said internal high negative voltage pump and said internal high positive voltage pump.

* * * * *